(12) United States Patent
Kato et al.

(10) Patent No.: US 8,518,733 B2
(45) Date of Patent: Aug. 27, 2013

(54) METHOD OF MANUFACTURING AN ELECTROMECHANICAL TRANSDUCER

(75) Inventors: Ayako Kato, Kawasaki (JP); Kazutoshi Torashima, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/610,219

(22) Filed: Sep. 11, 2012

(65) Prior Publication Data

US 2013/0071964 A1   Mar. 21, 2013

(30) Foreign Application Priority Data

Sep. 20, 2011   (JP) ................................. 2011-204970

(51) Int. Cl.
*H01L 21/02*   (2006.01)

(52) U.S. Cl.
USPC ............... 438/50; 438/48; 438/53; 29/594; 29/595; 73/715; 73/718; 257/E21.002

(58) Field of Classification Search
USPC ........... 438/48, 50, 53; 29/594, 595; 73/715, 73/718
See application file for complete search history.

(56) References Cited

U.S. PATENT DOCUMENTS

| | | | |
|---|---|---|---|
| 6,958,255 B2 | 10/2005 | Khuri-Yakub et al. | |
| 8,087,153 B2 | 1/2012 | Kato et al. | |
| 2007/0097791 A1* | 5/2007 | Chang et al. | 367/181 |
| 2007/0164632 A1 | 7/2007 | Adachi et al. | |
| 2008/0139946 A1 | 6/2008 | Adachi et al. | |
| 2009/0322181 A1* | 12/2009 | Machida et al. | 310/300 |
| 2012/0091543 A1* | 4/2012 | Torashima et al. | 257/415 |
| 2012/0256519 A1* | 10/2012 | Tomiyoshi et al. | 310/300 |
| 2012/0266682 A1 | 10/2012 | Torashima et al. | |
| 2012/0306316 A1* | 12/2012 | Nakamura et al. | 310/322 |
| 2012/0319535 A1* | 12/2012 | Dausch | 310/365 |
| 2013/0049526 A1* | 2/2013 | Chung | 310/300 |
| 2013/0049527 A1* | 2/2013 | Hasegawa et al. | 310/300 |
| 2013/0066209 A1* | 3/2013 | Matsuda | 600/443 |

FOREIGN PATENT DOCUMENTS

| | | |
|---|---|---|
| JP | 2009-194934 A | 8/2009 |
| JP | 2010-35156 A | 2/2010 |

OTHER PUBLICATIONS

Xuefeng Zhuang et al., "Integration of trench-isolated through-wafer interconnects with 2d capacitive micromachined ultrasonic transducer arrays," 138(1) Sensors and Actiators A 221-229 (Jul. 2007).
U.S. Appl. No. 13/592,416, filed Aug. 23, 2012.

* cited by examiner

*Primary Examiner* — Alexander Ghyka
(74) *Attorney, Agent, or Firm* — Fitzpatrick, Cella, Harper & Scinto

(57) ABSTRACT

Provided is a method of manufacturing an electromechanical transducer having a reduced variation in a breakdown strength caused by a variation in flatness of an insulating layer. In the method of manufacturing the electromechanical transducer, a first insulating layer is formed on a first substrate, a barrier wall is formed by removing a part of the first insulating layer, and a second insulating layer is formed on a region of the first substrate after the part of the first insulating layer has been removed. Next, a gap is formed by bonding a second substrate on the barrier wall, and a vibration film that is opposed to the second insulating layer via the gap is formed from the second substrate. In the forming of the barrier wall, a height on a gap side in a direction vertical to the first substrate becomes lower than a height of a center portion.

7 Claims, 12 Drawing Sheets

METHOD OF MANUFACTURING AN ELECTROMECHANICAL TRANSDUCER

BACKGROUND OF THE INVENTION

1. Field of the Invention

The present invention relates to a method of manufacturing an electromechanical transducer such as a capacitive transducer that is used as an ultrasound transducing device, and the like.

2. Description of the Related Art

Conventionally, a micromachined member manufactured by a micromachining technique is capable of being processed in micrometer orders, and various micro functional devices are realized by using the same. A capacitive transducer (Capacitive Micromachined Ultrasonic Transducer: CMUT) using such a technique is being studied as a replacement of piezo-electric devices. According to this CMUT, ultrasonic waves can be sent and received by using vibration of a vibration film, whereby a wide-band property, especially superior in liquid, can easily be obtained.

In regards to the above technique, there is a method of manufacturing a capacitive transducer by using a monocrystal silicon vibration film disposed on a silicon substrate by bonding and the like (see U.S. Pat. No. 6,958,255, and Sensors and Actuators A 138 (2007) 221-229). In U.S. Pat. No. 6,958,255, a thermally-oxidized film is formed on the silicon substrate, and bonding of silicon substrates is performed after having removed a part of the thermally-oxidized film, whereby a portion where the thermally-oxidized film had been removed becomes a vacant gap. After the bonding, the capacitive transducer is manufactured by exposing the monocrystal silicon vibration film to form a cell that uses the monocrystal silicon vibration film as a vibration film. In Sensors and Actuators A 138 (2007) 221-229, a thermally-oxidized film is formed on a silicon substrate, and a thermally-oxidized film is formed for the second time after having removed a part of the first thermally-oxidized film. Further, a protrusion of the thermally-oxidized film that had been generated at a portion that is to be a bonding interface is removed after having formed the thermally-oxidized film for the second time, and then bonding of silicon substrates is performed. After the bonding, a capacitive transducer is manufactured by processing the silicon substrate, exposing a monocrystal silicon vibration film, and forming a cell that uses the above as a vibration film.

SUMMARY OF THE INVENTION

As described above, the capacitive transducer can be manufactured by the steps of: forming the thermally-oxidized film on the silicon substrate; removing a part of the formed thermally-oxidized film to a position of the silicon substrate; and bonding the silicon substrates so that the vacant gap is formed between two bonded silicon substrates. The capacitive transducer is driven by applying voltages between two electrodes that are opposed to each other via the vacant gap. For insulation between the two electrodes, an inner wall of the vacant gap and a bottom surface of the vacant gap are preferably insulators. Conventionally, as shown in Sensors and Actuators A 138 (2007) 221-229, the insulator is provided on the bottom surface of the vacant gap by forming the thermally-oxidized film for the second time after having removed a part of the thermally-oxidized film to the position of the silicon substrate. However, when the thermally-oxidized film is formed for the second time, the protrusion of the thermally-oxidized film may be generated at the portion that is to be the bonding interface. Since this protrusion becomes a cause of a bonding failure of the silicon substrates, it is necessary to be removed prior to the bonding. While the bonding will become satisfactory if the protrusion is removed, there are cases in which a part of the thermally-oxidized film formed on the bottom surface of the vacant gap is removed upon removing the protrusion. Due to this, flatness of the insulating layer on the bottom surface of the vacant gap is deteriorated, whereby a distribution in a field intensity may be generated within the vacant gap upon application of voltage. When the distribution in the field intensity is generated, a breakdown strength may vary among cells or elements including the cells of the capacitive transducer, whereby reliability of the device decreases.

In view of the problem, according to the present invention, a method of manufacturing an electromechanical transducer includes: forming a barrier wall by forming a first insulating layer on a first substrate and removing a part of the first insulating layer to the first substrate; forming a second insulating layer on a region of the first substrate where the part of the first insulating layer has been removed; forming a gap by bonding a second substrate on the barrier wall; and forming a vibration film that is opposed to the second insulating layer via the gap from the second substrate, wherein, in the forming of the barrier wall, the barrier wall is formed such that a height of the barrier wall on a gap side becomes lower than a height of a center portion in a direction vertical to the first substrate.

According to the present invention, the barrier wall configured of the first insulating layer is formed prior to forming the second insulating layer. Since the barrier wall is formed such that the height of the barrier wall on the gap side in the direction vertical to the first substrate is lower than the height at the center portion, a protrusion on the barrier wall that is generated after having formed the second insulating layer can be reduced. Due to this, a process of removing the protrusion on the barrier wall prior to bonding the second substrate becomes unnecessary, and a variation in flatness of the insulating layer on the gap bottom surface can be reduced. Thus, according to the present invention, a variation in a breakdown strength among cells and among elements including the cells of the electromechanical transducer is reduced, whereby evenness of the device can be increased, and reliability thereof can be improved.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The present invention is characteristic in forming a barrier wall on a first substrate such that a height of the barrier wall on a gap side in a direction vertical to the substrate is lower than a height at a center portion, thereafter forming a second insulating layer that is an oxide film on the first substrate, and forming a gap by bonding a second substrate on the barrier wall. Although the first substrate is a silicon substrate in the below described embodiments and examples, it may be a substrate having a silicon layer formed on a sapphire plate and the like. The second substrate is a silicon substrate and the like, such as an SOI. A first insulating layer for forming the barrier wall may be an oxide film such as $SiO_2$, SiN, and the like, and the second insulating layer is an oxide film such as a thermally-oxidized film that generates a bird's beak. A vibration film that is opposed to a second insulating layer via the gap is a silicon film and the like formed from the second substrate, and it may be formed by thinning the second substrate.

Figure 1A:
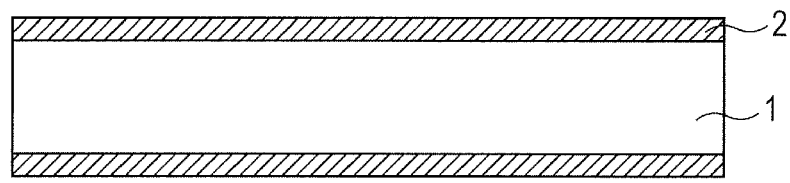
FIGS. 1A, 1B, 1C, 1D, 1E, 1F, and 1G are explanatory diagrams of a method of manufacturing a capacitive transducer according to an embodiment of the present invention.
Figure 2:
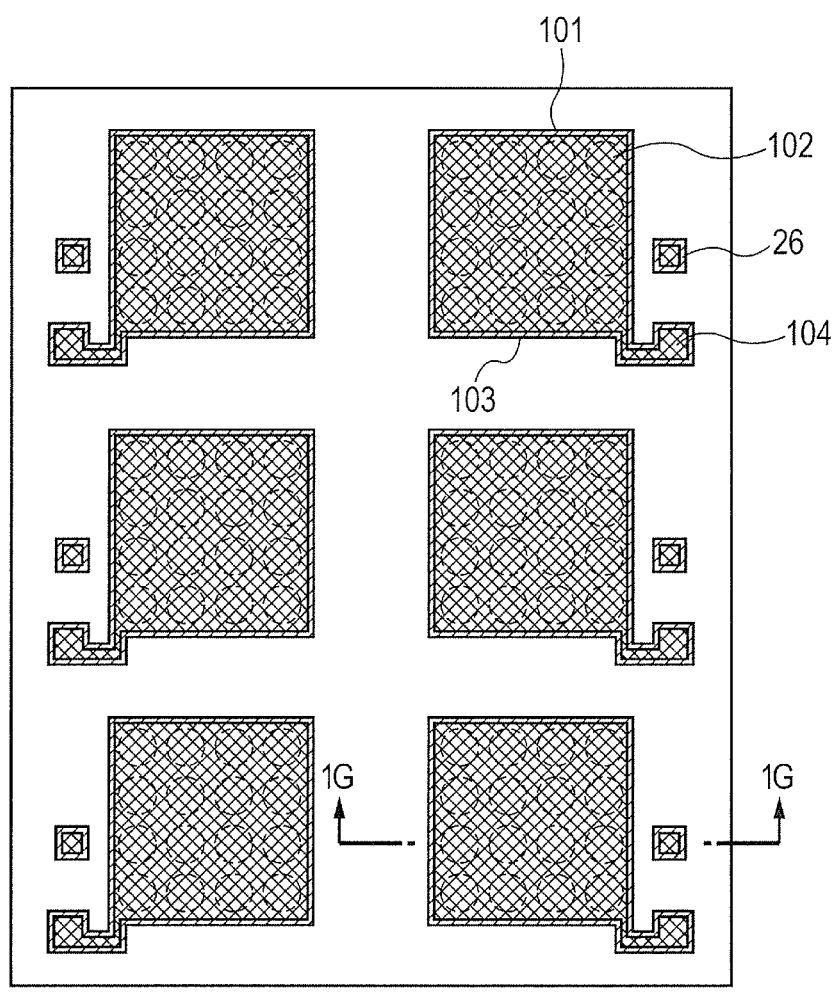
FIG. 2 is a top view explaining the capacitive transducer.
Figure 3:
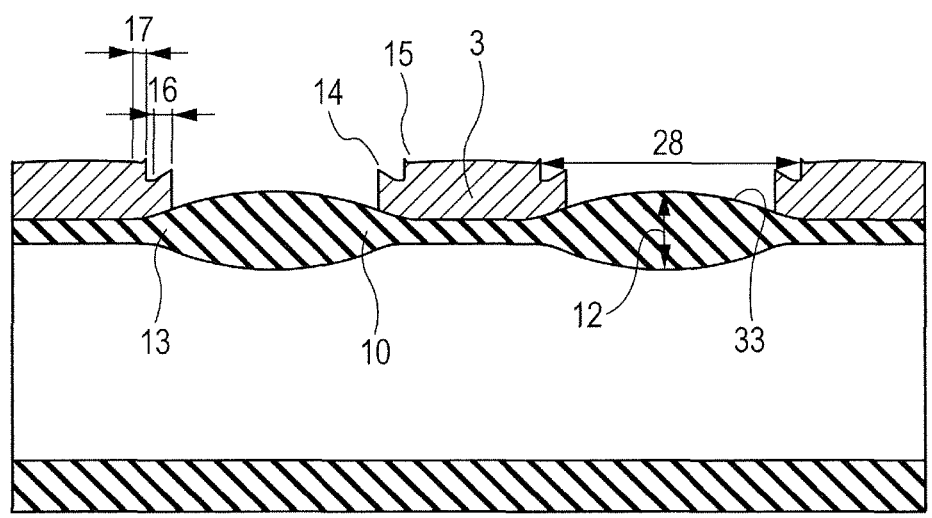
FIG. 3 is a partial enlarged view FIG. 1C.

Hereinbelow, a method of manufacturing a capacitive transducer that is an embodiment of the present invention will be described. FIG. 2 is a top view of the capacitive transducer, and FIG. 1G is a cross sectional view along 1G-1G of FIG. 2. FIG. 3 is a partially-enlarged view of FIG. 1C. As shown in FIG. 2, the capacitive transducer has a plurality of capacitive transducer elements 101, each including a plurality of cells 102, arranged in an array. In FIG. 2, although only six elements 101 are shown, the number of the elements may be determined as desired. Further, although an element is configured to have sixteen cells, the number of the cells may be determined as desired. Here, the cell has a round shape; however, it may be square, hexagonal, and the like. Further, arrangement positions of the cells 102 and the elements 101 may be determined as desired. As such, the capacitive transducer includes the plurality of elements 101, each including at least one cell 102 having a gap formed between one surface of the first substrate and the vibration film as will be described later.

As shown in FIG. 1G, the cells 102 includes a monocrystal silicon vibration film 23, gaps (vacant gaps decompressed from an atmospheric pressure, vacant gaps into which a gas is sealed, and the like) 24, a barrier wall 3 that is a supporting section supporting the vibration film 23, a first silicon substrate 1, and an electrode 27. The barrier wall 3 has a transverse cross sectional shape as shown in FIG. 1G. Compared to a vibration film that is deposited in lamination (for example, silicon nitride film), the monocrystal silicon vibration film 23 scarcely has a residual stress, it has a small thickness variation, and it has a small variation in a spring constant of the vibration film. Due to this, property variations among the elements and among the cells of the capacitive transducer become small.

The barrier wall 3 is preferably an insulator, which can be silicon oxide, silicon nitride, and the like. In a case of forming the monocrystal silicon vibration film 23 by a direct bonding, the barrier wall 3 is preferably silicon oxide. Here, for its purpose of being used as a mutual electrode among a plurality of elements, the first silicon substrate 1 is preferably a low resistance substrate which easily exhibits ohmic property, and its resistivity is preferably 0.1 Ωcm or less. The "ohmic" refers to a property in which a resistance value is constant irrelevant to a direction of a current and a magnitude of a voltage. Further, the monocrystal silicon vibration film 23 can be used as an electrode pad 104 for extracting signals by being divided at a portion of an electric separation boundary 103 in FIG. 1G (see FIG. 2). In order to improve conductive properties of the first silicon substrate 1 and the monocrystal silicon vibration film 23, metal films such as thin aluminum may be formed on the first silicon substrate 1 and the vibration film 23. Since the monocrystal silicon vibration film 23 is used as the signal outputting electrode, it is preferable for the monocrystal silicon vibration film 23 to have a low resistance, and a resistivity thereof is preferably 0.1 Ωcm or less.

Figure 1B:
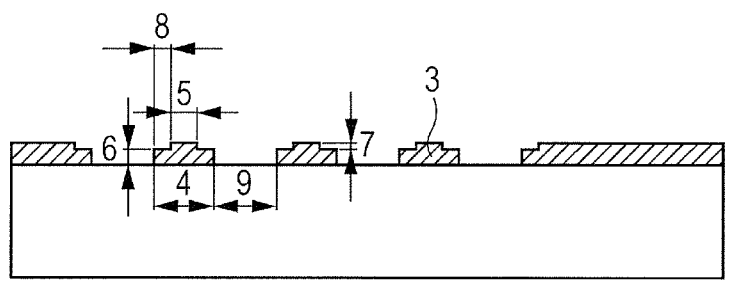

The barrier wall 3 of the cells 102 configuring the element 101 of the present embodiment has a transverse cross sectional width 4 on a first silicon substrate side that is larger than a transverse cross sectional width 5 on an opposite side thereof (see FIG. 1B). From another aspect, as shown in FIG. 3, it may be said that a height of the barrier wall 3 on a gap 24 side to be described later is lower than a height of a center portion of the barrier wall 3. The barrier wall 3 is formed prior to forming a second insulating layer 10 by oxidation. Due to this, protrusions that are generated in the barrier wall 3 after having formed the second insulating layer 10 can be reduced. Thus, a process to remove the protrusions prior to bonding a second silicon substrate 18 (see FIG. 1D) becomes unnecessary, and a variation in flatness of gap bottom surfaces 33 (a variation in a thickness 12 of the second insulating film 10) can be reduced. According to the present embodiment, the variations in breakdown strength of the elements and the cells of the capacitive transducer can be reduced, whereby evenness among the cells in the element and among the elements can be increased, and reliability can be improved.

A driving principle of the embodiment will be described. In receiving ultrasonic waves by the capacitive transducer, a direct-current voltage is applied to the monocrystal silicon vibration film 23 by a voltage applying unit that is not shown. Since the monocrystal silicon vibration film 23 deforms when the ultrasonic waves are received, a distance 22 between the vibration film 23 and the first silicon substrate 1 changes (see FIG. 1D), and an electrostatic capacitance changes. A current flows in the monocrystal silicon vibration film 23 due to the change in this electrostatic capacitance. The current is converted into a voltage by a current-voltage converting device that is not shown, and the ultrasonic waves can be received thereby. Further, the direct current voltage and an alternating current voltage can be applied to the monocrystal silicon vibration film 23, and the vibration film 23 can be vibrated by an electrostatic force. Due to this, the ultrasonic waves can be sent.

Next, a configuration, a manufacturing method, and the like of the capacitive transducer of the present embodiment will be described in detail with reference to FIGS. 1A to 1G, FIGS. 4A to 4I, and the like in comparison with a comparative example. FIGS. 7A, 7B, 8A, and 8B are graphs showing relationships of a height and a width of protrusions caused by bird's beaks and a thickness and the like of the second insulating layer to be described later.

In the manufacturing method, firstly, as shown in FIG. 1A, a first insulating layer 2 is formed on a first silicon substrate 1. The first silicon substrate 1 is a low resistance substrate, of which resistivity being preferably 0.1 Ωcm or less. The first insulating layer 2 can be silicon oxide, silicon nitride, and the like. The first insulating layer 2 can be formed by Chemical Vapor Deposition (CVD) or thermal oxidation, and the like. The thermal oxidation can be performed by wet oxidation using oxygen and hydrogen, or dry oxidation using oxygen. An oxidation temperature is preferably about 800 to 1100 degrees Celsius.

Next, as shown in FIG. 1B, parts of the first insulating layer 2 are removed to the silicon substrate 1, and the barrier wall 3 is formed discretely having an arrangement interval 9. The barrier wall 3 can be formed by dry etching, wet etching, and the like. As shown in FIG. 1B, the barrier wall 3 is formed so as to have the width 4 on the first silicon substrate side be larger than the width 5 on the opposite side thereof; in other words, so as to have the height of the barrier wall on the gap 24 side be lower than the height of the center portion. Due to this, in the process of forming the barrier wall 3, the barrier wall is formed such that the height of the barrier wall on the gap side after a process of forming the second insulating layer to be described later does not become higher than the height of the center portion. A wall surface shape of the barrier wall 3 (a cross sectional shape that is vertical to the first silicon substrate) may have a step shape as in FIG. 1B, or may have a sloped shape as in an example to be described later. The wall surface of the barrier wall in the step shape may be in a step shape including at least one level. By providing the barrier wall 3 in such shapes, the protrusions (see a process of FIG. 4C) that may be generated after having formed the second insulating layer 10 can be reduced. Protrusions 14, as shown in FIG. 4C explaining the comparative example, are generated due to bird's beaks 13. The bird's beaks 13 are the oxide film in a shape of a beak of a bird. The bird's beaks 13 are generated at portions where an amount of thermal oxidation in the first silicon substrate 1 locally changes and becomes uneven upon forming the second insulating layer 10 by thermally oxidizing the first silicon substrate 1 after the formation of the barrier wall 3, by an occurrence of a phenomenon of oxygen invasion to underneath the barrier wall. For example, when there is a level in the first silicon substrate 1, or when different substances are present as in FIG. 4C (which is herein the barrier wall 3), the amount of thermal oxidation locally changes and becomes uneven at some portions, and the bird's beaks 13 are generated therein. Due to this phenomenon, the protrusions 14 bulged up by the bird's beak 13 as shown in FIG. 4C are generated at an interface of the barrier wall on a side on which the second silicon substrate 18 is to be bonded.

Figure 1C:
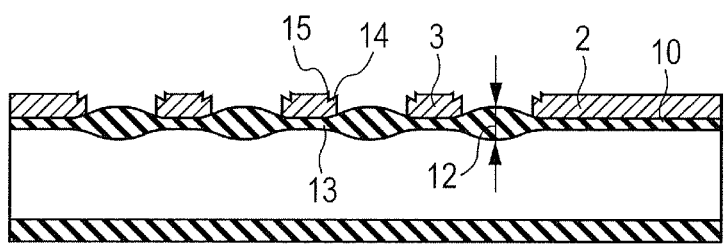
Figure 1D:
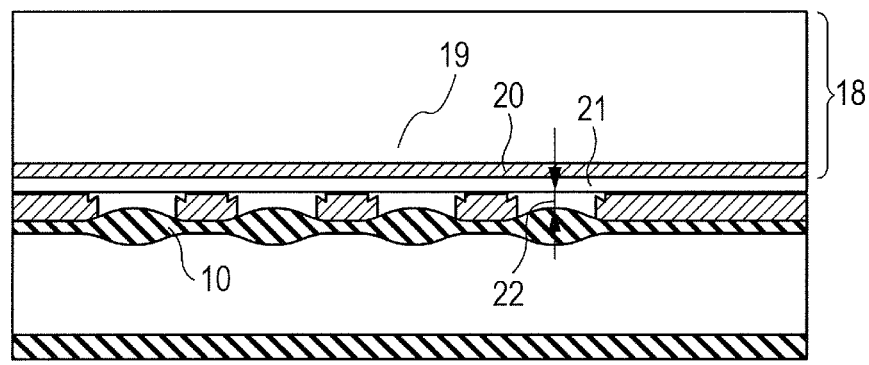
Figure 1E:
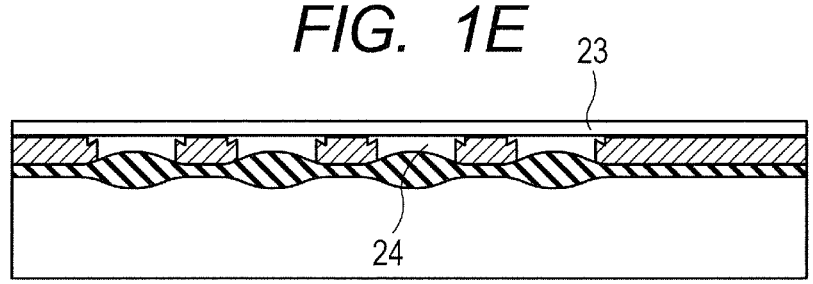
Figure 1F:
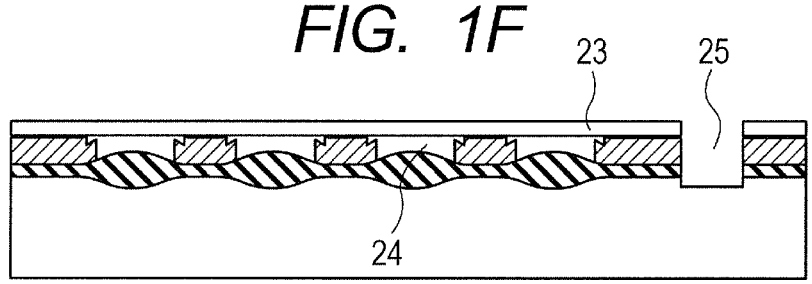
Figure 1G:
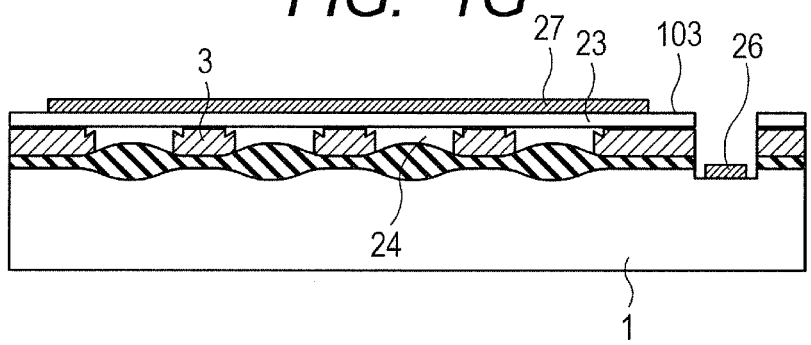

Returning to the description of FIGS. 1A to 1G, as shown in FIG. 1C, the second insulating layer 10 is formed. In the case of FIG. 1C, first protrusions 14 are generated by the bird's beak 13. The first protrusions 14 are generated because the amount of thermal oxidation on the first silicon substrate 1 side becomes uneven in a region in the vicinity of the wall surface of the barrier wall, due to the barrier wall 3 being an insulating layer, and due to a difference of the height having an amount of a height 6 of a first level of the barrier wall 3 from a surface of the first silicon substrate 1. Further, as shown in FIG. 1C, second protrusions 15 are also generated. The second protrusions 15 are generated because the amount of thermal oxidation on the first silicon substrate 1 side becomes uneven due to a difference of the height having an amount of a height 7 of a second level of the barrier wall 3 from the height 6 of the first level. Also, other than those portions shown in FIG. 1C, the bird's beaks 13 are generated where nonuniformity is present in the amount of thermal oxidation. The present embodiment forms the wall surface shape of the barrier wall 3 in the step shape so as to control the amounts and positions of the protrusions 14 and 15 generated by the bird's beaks, and performs satisfactory bonding with the second silicon substrate 18.

Figure 7A:
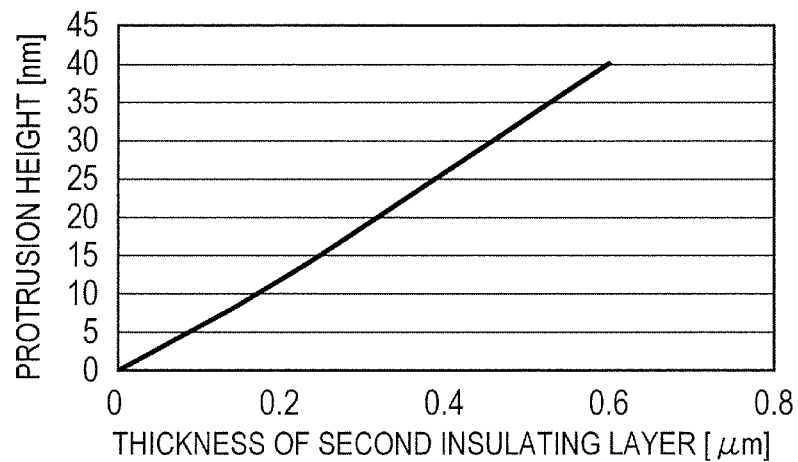
FIG. 7A is a graph illustrating a relation between a thickness of a second insulating layer and a protrusion height.

Here, the amounts and positions of the protrusions generated by the bird's beaks will be described with reference to FIGS. 7A, 7B, 8A and 8B. A horizontal axis of FIG. 7A is the thickness of the thermally-oxidized film in the case of having formed the second insulating layer 10 using wet oxidation at 1050 degrees Celsius with the barrier wall 3 having the configuration shown in FIG. 4B. A vertical axis is the height of the protrusions 14 generated by the bird's beaks. As shown in FIG. 7A, the height of the protrusions 14 generated by the bird's beaks increases proportionate to the thickness of the second insulating layer 10. This is due to the amount of the bird's beaks being increased by the thickness of the second insulating layer 10. The protrusions 14 generated by the bird's beaks increase as in FIG. 7A until the second insulating layer 10 comes to have a certain thickness, and when the certain thickness is exceeded, they decrease proportionate to the thickness of the second insulating layer 10 (not shown). The thickness of the insulating layer by which the decrease of the protrusions 14 generated by the bird's beaks starts depends on a temperature upon forming the thermally-oxidized film. The thickness of the second insulating layer by which the decrease starts tends to be thicker as the forming temperature of the thermally-oxidized film becomes lower. Further, an inclination of increase and decrease also depends on the temperature upon forming the thermally-oxidized film. The inclination of increase and decrease tends to be milder and a size of the protrusions 14 generated by the bird's beaks tends to become larger in both the height and the width as the forming temperature of the thermally-oxidized film becomes lower. For example, in the case of the wet oxidation at 1050 degrees Celsius, the height of the protrusions generated by the bird's beaks comes to the peak when the thickness of the second insulating layer 10 is around 1 $\mu$m. The size and the like of the protrusions generated by the bird's beaks may depend on a difference in the technique (dry oxidation, wet oxidation) used to form the thermally-oxidized film, and on a crystal orientation of the first silicon substrate 1.

Figure 7B:
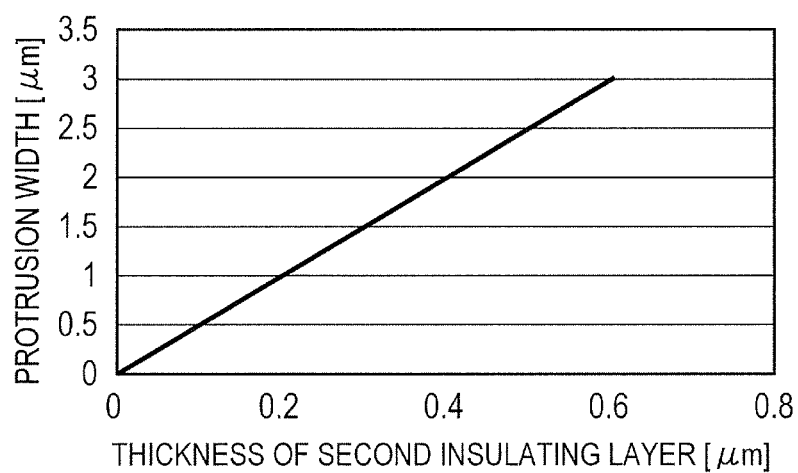
FIG. 7B is a graph illustrating a relation between a thickness of a second insulating layer and a protrusion width.

A horizontal axis of FIG. 7B is identical to the horizontal axis of FIG. 7A, and a vertical axis is the width 16 of the protrusions 14 generated by the bird's beaks (see FIG. 3). Similar to the height of the protrusions 14 generated by the bird's beaks in FIG. 7A, the width of the protrusions 14 generated by the bird's beaks in FIG. 7B increases proportionate to the thickness of the second insulating layer 10. Further, when the second insulating layer 10 exceeds a certain thickness, it decreases proportionate to the thickness of the second insulating layer 10. Remainders thereof are similar to the case of the height of the protrusions 14.

Figure 8A:
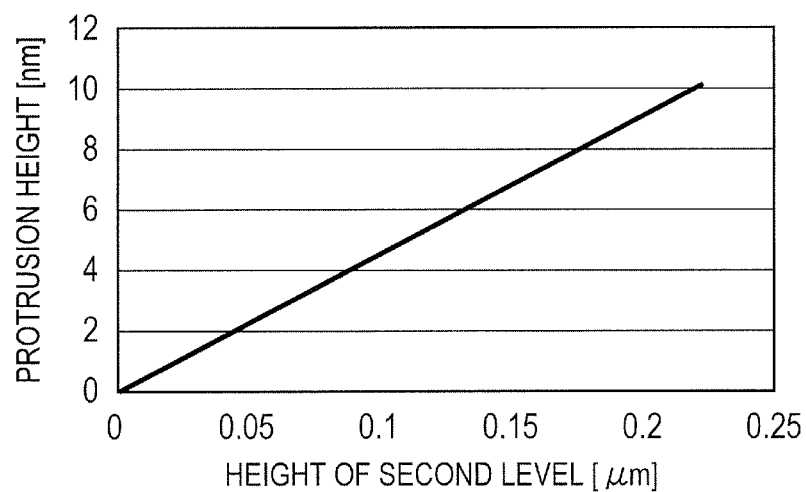
FIG. 8A is a graph of a height of a second level of a barrier wall and the protrusion height.
Figure 8B:
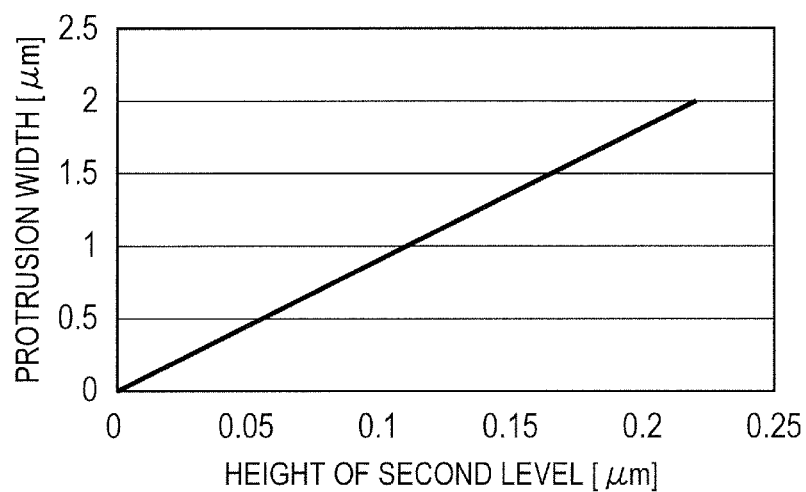
FIG. 8B is a graph of a height of a second level of a barrier wall and the protrusion width.

A horizontal axis of FIG. 8A is a height 7 of the second level of the barrier wall 3 of the present embodiment, and a vertical axis is the height of the second protrusions 15 generated upon forming the second insulating layer 10 using the wet oxidation at 1050 degrees Celsius. As shown in FIG. 8A, as the height 7 of the second level of the barrier wall 3 increases, the height of the protrusions 15 also increases. The relationship of the height and the amount of thermal oxidation of the second protrusions 15 generated by the bird's beaks is similar to the description of FIG. 7A. A horizontal axis of FIG. 8B is the height 7 of the second level of the barrier wall 3, and a horizontal axis is a width 17 of the second protrusions 15 generated upon forming the second insulating layer 10 using the wet oxidation at 1050 degrees Celsius (see FIG. 3). As shown in FIG. 8B, the width of the protrusion 15 increases as the height 7 of the second level of the barrier wall 3 increases. The relationship of the width and the amount of thermal oxidation of the protrusions 15 generated by the bird's beaks is similar to the description of FIG. 7B.

As described in the descriptions of FIGS. 7A, 7B, 8A and 8B, the heights 14 and 15 and widths of the protrusions generated by the bird's beaks can be controlled by determining the levels to be predeterminedly formed in the barrier wall 3 in accordance with the thickness of the second insulating layer. For example, the case of the wet oxidation with the thermal oxidation temperature of 1050 degrees Celsius will be described. When the height of the second protrusions 15 is desired to be at 3 nm, according to FIG. 8A, the height 7 of the second level of the barrier wall 3 can be formed at 66 nm. In considering the bonding with the second silicon substrate 18, a lower height of the second protrusion 15 is more preferable. In the case of bonding using a fusion bonding to be described later, a surface roughness is preferably Rms <5 nm. For example, when the height of the second protrusions 15 is desired to be at 0.5 nm, the height 7 of the second level of the barrier wall 3 needs to be at 11 nm. However, from FIG. 7A, since the first protrusions 14 will be 12 nm in the case of forming the second insulating layer 10 at 200 nm, the protrusions 14 of the first level of the barrier wall 3 come to reach the bonding interface. When the protrusions of the first level of the barrier wall 3 reach the bonding interface, they come in contact with a surface silicon layer 21 (to be described later) of the second silicon substrate 18 and be bonded thereto. Accordingly, after having undergone processes of FIGS. 1D to 1G to be described later, a junction with the monocrystal silicon vibration film 23 is formed at portions other than the bonding interface of the barrier wall 3, and the vibration property of the monocrystal silicon vibration film 23 will be changed thereby. Due to this, the height 7 of the second level of the barrier wall 3 is preferably set at or more than a height that would not allow the first protrusions 14 to reach the bonding interface when the second insulating layer 10 is formed at the desired thickness, which is a height by which no junction failure is generated with the second protrusions 15. Assuming that the second insulating layer 10 is 200 nm, the height 7 of the second level of the barrier wall 3 is preferably 12 nm or more and 110 nm or less. Assuming that the second insulating layer 10 is 400 nm, the height 7 of the second level of the barrier wall 3 is preferably 27 nm or more and 110 nm or less.

Further, from the relationship of the width of the protrusions 14 generated by the bird's beaks and the thickness of the second insulating layer 10, a width 8 between the first level and the second level of the barrier wall 3 can be a width including a width 16 of the protrusion 14 generated by the desired thickness of the second insulating layer 10 (see FIG. 3). Assuming that the second insulating layer 10 is 200 nm, it is preferable to be set at 1 μm or more. Assuming that the second insulating layer 10 is 400 nm, it is preferable to be set at 2 μm or more. Typically, in the elements of the capacitive transducer, since the gaps 24 to be described later are evacuated, the monocrystal silicon vibration film 23 is in a state of being concaved toward a direction of the gap bottom surfaces 33 under an atmospheric pressure. In driving under this state, the monocrystal silicon vibration film 23 is further convexed toward a gap bottom surface 33 side. When the width 8 between the first level and the second level of the barrier wall 3 is made too large relative to a cell diameter 28 (see FIG. 3), the monocrystal silicon vibration film 23 and the first protrusions 14 may make contact. Although it depends on a magnitude of the height of the second level of the barrier wall 3, since the vibration property of the monocrystal silicon vibration film 23 might be changed when the width 8 between the first level and the second level of the barrier wall 3 is too large, the width is preferably a minimum necessary width. Since the width 16 of the protrusions generated by the bird's beaks is proportionate to the thickness of the second insulating layer 10, reaches its peak at the certain thickness and thereafter decreases, the width 8 between the first level and the second level of the barrier wall can be made smaller than the width 16 at the peak. In the case of forming the same with the wet oxidation at 1050 degrees Celsius, the width 8 is preferably 10 μm or less.

In FIGS. 7A, 7B, 8A, and 8B, an example in which the barrier wall 3 has the two-leveled step shape has been explained, however, as has been described above, the barrier wall 3 may include two levels or more. The heights and widths of the protrusions generated at the bonding interface with the second silicon substrate 18 become smaller when a level difference is smaller, and the bonding becomes satisfactory. As shown in FIG. 5B, when a difference in a change in a forming amount of the thermally-oxidized film is made moderate by providing an inclined surface shape, an effect similar to that resulting from making the level difference small can be obtained. Larger radius of curvature of an inclined surface of the barrier wall 3 is more preferable, because the difference in the change in the forming amount of the thermally-oxidized film can be made more moderate. At this occasion, similar to FIGS. 7A, 7B, 8A, and 8B, it is preferable that the monocrystal silicon vibration film 23 and the inclined surface do not make contact after having formed the second insulating layer 10 and bonded the second silicon substrate 18. Further, it is also preferable that the monocrystal silicon vibration film 23 and the inclined surface do not make contact upon applying a voltage in a state shown in FIG. 5G.

Next, as shown in FIG. 1D, the second silicon substrate 18 is bonded on a side of the first silicon substrate 1 where the barrier wall 3 is formed. The second silicon substrate 18 and the barrier wall 3 on the first silicon substrate 1 are bonded by fusion bonding. A fusion bonding is performed by an intermolecular force by stacking polished silicon substrates or substrates having an $SiO_2$ film formed thereon and performing thermal treatment. When surfaces are stacked in atmosphere, OH radicals of Si—OH form hydrogen bonds. When heated to a several hundred degrees Celsius under this state, $H_2O$ molecules are cut off from the OH radicals, and bonding by oxygen takes place. Further, at 1000 degrees Celsius or more, the oxygen is dispersed in a silicon wafer, and bonding between Si atoms occurs. In FIG. 1D, an SOI substrate is used as the second silicon substrate 18. The SOI substrate is a substrate having a structure in which a silicon oxide layer 20 (BOX layer) is inserted between a silicon substrate 19 (handle layer) and a surface silicon layer 21 (active layer).

Next, as shown in FIG. 1E, the second silicon substrate 18 is thinned, and the monocrystal silicon vibration film 23 is formed. Since the thickness of the monocrystal silicon vibration film is preferably at or less than a few μm, the second silicon substrate 18 is thinned by performing etching, grinding, or CMP (Chemical Mechanical Polishing). It can be thinned up to about 2 μm by back grinding and CMP. As shown in FIG. 1E, in the case of using the SOI substrate as the second silicon substrate, the thinning of the SOI substrate is performed by removing the handle layer 19 and the BOX layer 20. The handle layer 19 can be removed by grinding, CMP, or etching. The BOX layer 20 can be removed by oxidized film etching (dry etching, or wet etching such as by hydrofluoric acid). Since the wet etching such as by hydrofluoric acid can prevent silicon from being etched, such is more preferable due to being able to reduce a thickness variation of the monocrystal silicon vibration film 23 caused by etching. Since the active layer 21 of the SOI substrate has a small thickness variation, the thickness variation in the monocrystal silicon vibration film 23 can be reduced, a variation in a spring constant of the vibration film 23 can be reduced, and a property variation in the capacitive transducer can be reduced.

Next, an electrode that is necessary for applying voltages and extracting signals while driving the capacitive transducer is formed. The electrode simply needs to be able to apply voltages between the monocrystal silicon vibration film 23 and the first silicon substrate 1, and its forming position and structure are not particularly limited. The monocrystal silicon vibration film 23 may be used as a common electrode, the first silicon substrate 1 may be divided, and a divided silicon substrate 1 may be used as a signal extracting electrode. Further, the first silicon substrate 1 may be used as the common electrode, and the monocrystal silicon vibration film 23 may be used as the signal extracting electrode.

The example shown in FIGS. 1F and 1G has the configuration of using the monocrystal silicon vibration film 23 as the signal extracting electrode and the first silicon substrate 1 as the common electrode, and it is an example of a configuration of forming wirings and the electrode pad of the signal extracting electrode on the vibration film 23 side. In FIG. 1F, a contact hole 25 is formed in order to secure conduction of the first silicon substrate 1. In FIG. 1G, the electrode 27, the wirings, and the electrode pad 26 are formed. These processes will be described in detail in an example 1 to be described later.

Next, as shown in FIG. 1G, the monocrystal silicon vibration film 23 is removed at a portion of each electric separation boundary 103 in order to electrically separate the capacitive transducer elements 101 having the cells from a remaining portion. The monocrystal silicon vibration film 23 can be removed by dry etching, wet etching, and the like. Due to this, the capacitive transducer elements 101 are electrically separated from the portion not having the cells 102. A voltage can be applied to the capacitive transducer elements 101 by applying a voltage between the respective first electrode pad 26 and second electrode pad 104 shown in FIG. 2, whereby the capacitive transducer elements 101 can be driven.

The method of manufacturing the capacitive transducer of the present embodiment can control the generation of the protrusions at the bonding interface caused by the bird's beaks 13 that are generated upon forming the second insulating film 10 by providing the step shaped barrier wall 3 prior to forming the second insulating film 10. The barrier wall 3 characteristically has a wider width 4 on the first silicon substrate 1 side than the width 5 on the opposite side thereof. Due to this, the process of removing the protrusions prior to bonding the second silicon substrate becomes unnecessary, and the variation in the flatness of the insulating layer at the gap bottom surfaces can be reduced. Due to this, the variation in the breakdown strength of the elements and cells of the capacitive transducer can be reduced, the evenness of the elements can be increased, and the reliability of the device can be improved.

Next, the aforementioned comparative example will be described. A manufacturing method of the comparative example will be described with reference to FIGS. 2, 4A, 4B, 4C, 4D, 4E, 4F, 4G, 4H, and 4I. FIGS. 4A to 4I are the manufacturing method of the comparative example in a case where a width 4 of a barrier wall 3 on a first silicon substrate 1 side is the same as a width 5 on the other side. FIG. 4I is a partial enlarged diagram of FIG. 4D. As shown also in FIG. 4A of the comparative example, a first insulating layer 2 is formed on the first silicon substrate 1. In the present comparative example, it is formed by wet oxidation. An oxidation temperature is 1050 degrees Celsius. Resistivity of the first silicon substrate 1 is 0.01 Ωcm. The first insulating layer 2 is silicon oxide formed by thermal oxidation, and its thickness is 220 nm. The silicon oxide formed by thermal oxidation has a very small surface roughness, so an increase in the surface roughness of the first silicon substrate can be prevented even if the silicon oxide is formed on the first silicon substrate, where the surface roughness is Rms=0.2 nm or less. Especially in a case of bonding by using fusion bonding, when this surface roughness is large, for example Rms=5 nm or more, the bonding becomes difficult and a bonding failure may be caused. In the case of the silicon oxide formed by thermal oxidation, the bonding failure is unlikely to occur because the surface roughness is not increased, whereby a manufacturing yield can be improved.

Figure 4A:
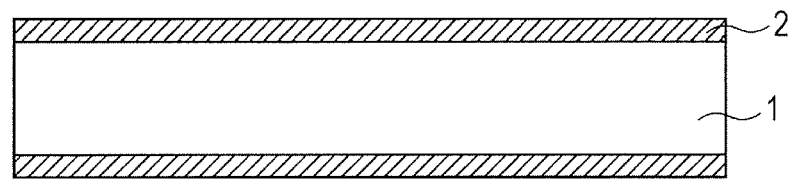
FIGS. 4A, 4B, 4C, 4D, 4E, 4F, 4G, 4H, and 4I are explanatory diagrams for a manufacturing method for a capacitive transducer in a comparative example.
Figure 4B:
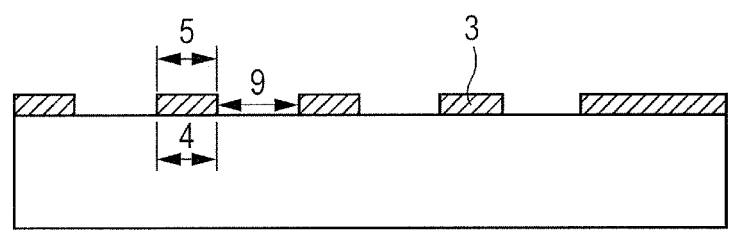
Figure 4C:
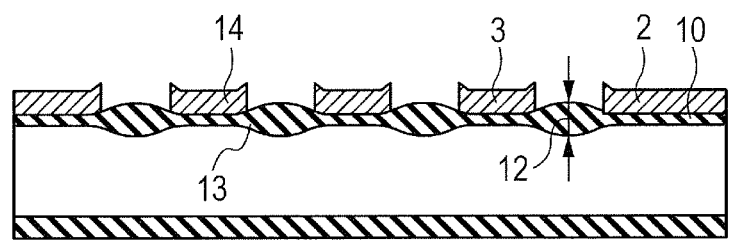

Next, as shown in FIG. 4B, a barrier wall 3 is formed. The barrier wall 3 can be formed by wet etching or dry etching. A height of the barrier wall 3 is 220 nm that is the same as the thickness of the first insulating layer 2. Widths 4 and 5 thereof are 11 μm. An arrangement interval 9 of the barrier wall 3 is 39 μm, and is formed such that cells 102 are arranged in four rows by four columns. Next, as shown in FIG. 4C, a second insulating layer 10 is formed. In the present comparative example, it is formed by wet oxidation. An oxidation temperature is 1050 degrees Celsius. The insulating layer 10 is silicon oxide formed by thermal oxidation, and its thickness 12 is 200 nm at bottom surfaces 33 of gaps 24. When the second insulating layer 10 is formed, bird's beaks 13 are generated at ends of the barrier wall 3. Due to this phenomenon, protrusions 14 that are pushed up by the bird's beaks 13 are generated at a boundary at which a second silicon substrate 18 is to be bonded. A height of the protrusions 14 is 12 nm, and a width is 1 μm. If the fusion bonding with the second silicon substrate 18 as shown in FIG. 4E is performed under a state in which the protrusions 14 are present as shown in FIG. 4C, the bonding failure occurs and thus a subsequent process cannot be performed, so a process shown in FIG. 4D is performed.

Figure 4D:
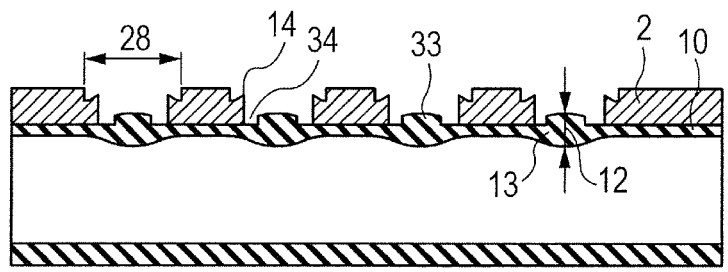

In the process of FIG. 4D, the protrusions 14 generated at the boundary to which the second silicon substrate 18 is to be bonded are removed. The removal of the protrusions 14 can be performed by a removal by dry etching or wet etching. In the present comparative example, the removal by dry etching is performed. In removing the protrusions 14, a displacement in an alignment of a photo mask is taken into consideration, and a region of 39 μm±3 μm is removed in a doughnut shape to correspond to 39 μm of each arrangement interval 9 of the barrier wall 3. A removed amount is 50 nm, and a cell diameter 28 is formed after the removal. FIG. 4I shows an enlarged diagram of the structure after the removal. By removing in the doughnut shape, the protrusions 14 after the removal are at positions lowered toward the first silicon substrate 1 side by 50 nm from their positions prior to the removal. A size and width of the protrusions at the removed portions are the same as a size and width of the protrusions 14 before the removal. With respect to 39 μm of the arrangement interval 9 of the barrier wall 3 before the removal, due to the width of each removed section being broadened by 3 μm toward both ends after the removal, the cell diameter 28 at the boundary at which the second silicon substrate 18 is to be bonded becomes about 45 μm. Due to this, the boundary to bond the second silicon substrate 18 becomes flat. Further, since the displacement in the alignment of the photo mask is taken into consideration, parts of the second insulating layer 10 at the gap bottom surfaces are removed, whereby annular recesses 34 with a width 29 are generated.

Figure 4E:
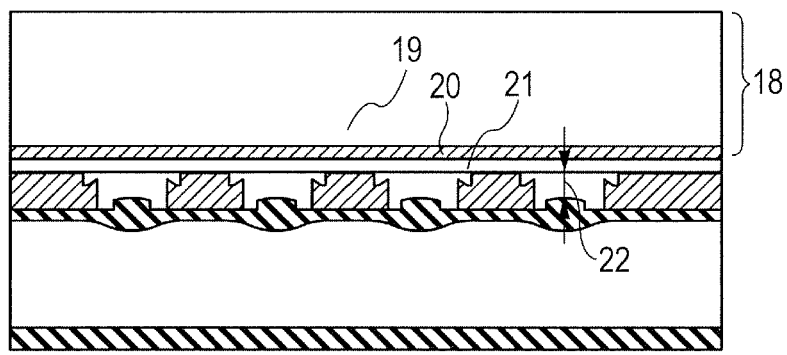
Figure 4F:
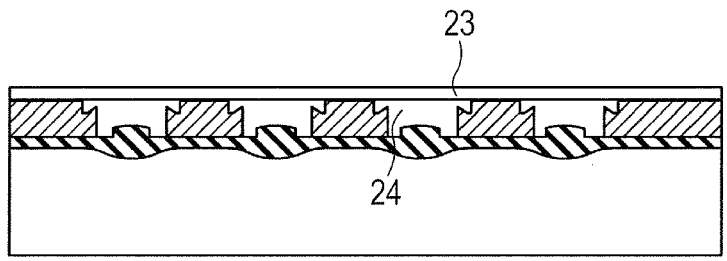
Figure 4G:
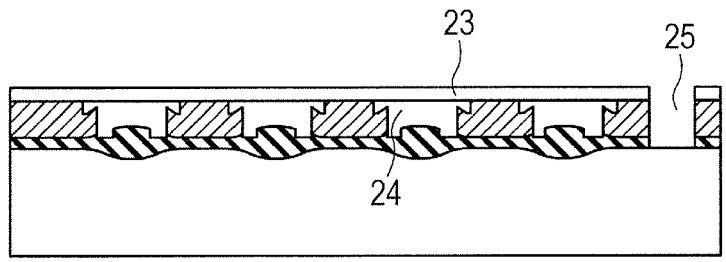

Next, as shown in FIG. 4E, the second silicon substrate 18 is fusion bonded. In FIG. 4E, an SOI substrate is used as the second silicon substrate 18. Next, as shown in FIG. 4F, the second silicon substrate 18 is thinned, and a monocrystal silicon vibration film 23 is formed. The gaps 24 configure capacitors of the capacitive transducer. Next, as shown in FIG. 4G, a contact hole 25 is formed so as to ensure conduction of the first silicon substrate 1 from a side on which the vibration film 23 is formed. Firstly, a part of the vibration film at a portion where the contact hole is to be formed is removed by dry etching, wet etching, and the like. Next, the insulating layer is removed by dry etching, wet etching, and the like. Due to this, the first silicon substrate 1 is exposed, and the contact hole 25 can be formed. In the present comparative example, the portion of the vibration film where the contact hole is to be formed is removed by dry etching, and the insulating layer is removed by wet etching. Due to this, the first silicon substrate 1 is exposed, and thus the contact hole can be formed.

Figure 4H:
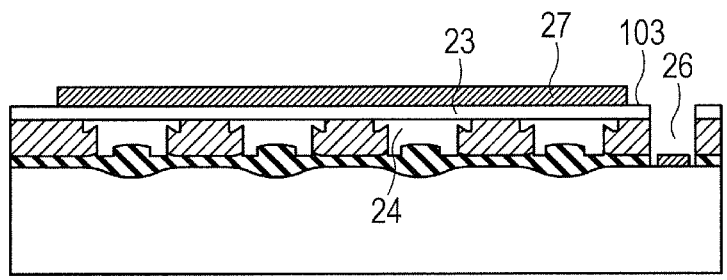
Figure 4I:
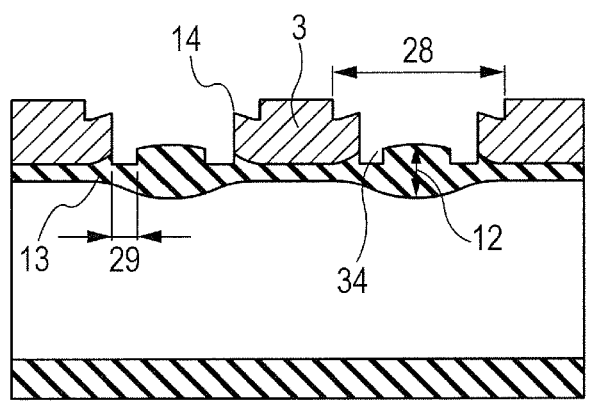

Next, as shown in FIG. 4H and FIG. 2, an electrode 27 and a first electrode pad 26 necessary for applying voltages to respective capacitive transducer elements 101 are provided. Firstly, in order to improve conductive properties of the first silicon substrate 1 and the monocrystal silicon vibration film 23, metal films having satisfactory conductivity are formed on the first silicon substrate 1 and the monocrystal silicon vibration film 23. The metal films may use metal such as Al, Cr, Ti, Au, Pt, Cu, and the like. The metal film that is to be the electrode 27 has a desired thickness, and it is preferable to have a thickness at a degree that would not obstruct vibration of the vibration film. Further, a portion that connects the electrode 27 and the second electrode pad 104 preferably has a thickness that would exhibit a desired wiring resistance. The metal films that are to be the first electrode pad 26 and the second electrode pad 104 preferably have thicknesses at a degree by which conduction can be ensured. The thicknesses of these metal films may be formed as the same thickness by being formed by a single deposition and etching, or may be formed by plural times of deposition and etching so as to have different thicknesses. After the deposition of the metal films, the electrode 27, the first electrode pad 26, and the second electrode pad 104 are formed by patterning. Positions to provide the electrode pad and the wirings may be set at desired positions. In the present comparative example, Al is deposited at 200 nm, and the electrode 27, the wirings, the first electrode pad 26, and the second electrode pad 104 are formed by patterning. Next, the monocrystal silicon vibration film 23 at portions other than where Al had been provided is removed by dry etching. Due to this, the capacitive transducer elements 101 are electrically separated from their peripheries not having cells at an electric separation boundary 103. A voltage can be applied to the capacitive transducer elements 101 by applying a voltage between the respective first electrode pad 26 and second electrode pad 104.

A breakdown voltage of the cells 102 of the capacitive transducer array produced in the present comparative example will be described with reference to FIG. 4I. In FIG. 4D, by having removed the protrusions 14, thickness of the second insulating film 10 at the gap bottom surfaces becomes different, and the flatness of the gap bottom surfaces is deteriorated. In the case of the present comparative example, relative to 200 nm of the thickness 12 of the second insulating film 10 at the gap bottom surfaces, the thickness of the second insulating film 10 at lower portions of the recesses 34 caused by removing the protrusions is 150 nm or less. A variation in the breakdown voltage becomes 160 to 120 V, where the variation is 25%. In a case where the thickness of the second insulating film 10 at the lower portions of the recesses 34 is further thinned, the variation in the breakdown voltage becomes larger. The present invention suppresses the variation in the breakdown voltage by making the process as in the process of FIG. 4D unnecessary by forming the barrier wall so that the width on the first substrate side becomes larger than the width on the opposite side.

Hereinbelow, more specific examples of the present invention will be described.

EXAMPLE 1

Example in Case of Providing a Step-Shaped Barrier Wall

A method of manufacturing a capacitive transducer of the example 1 will be described with reference to FIG. 1A to FIGS. 1G, 2, and 3. The present example corresponds substantially to the above embodiment.

In the present example also, as shown in FIG. 1A, a first insulating layer 2 is formed on a first silicon substrate 1. Formation hereof can be performed similar to FIG. 4A of the comparative example. Next, as shown in FIG. 1B, a barrier wall 3 is formed. The barrier wall 3 can be formed by wet etching or dry etching. A width 4 of the barrier wall 3 on a first silicon substrate 1 side is 17 µm, and a height 6 of a first level of the barrier wall 3 is 175 nm. A width 5 on the other side is 5 µm, and a height of a second level of the barrier wall 3 is 45 nm. Further, a width 8 between the first level and the second level of the barrier wall 3 is 3 µm. An arrangement interval 9 of the barrier wall 3 is 33 µm, and cells are formed to be arranged four rows by four columns.

Next, as shown in FIG. 1C and FIG. 3, a second insulating layer 10 is formed. In the present example also, the second insulating layer 10 is formed by wet oxidation. An oxidation temperature is 1050 degrees Celsius. The second insulating layer 10 is silicon oxide formed by thermal oxidation, and its thickness 12 is 200 nm at bottom surfaces 33 of gaps 24. When the second insulating layer is formed, the aforementioned bird's beaks 13 are generated at ends of the barrier wall 3. Due to this phenomenon, first protrusions 14 and second protrusions 15 that are pushed up by the bird's beaks 13 are generated at a boundary at where a second silicon substrate 18 is to be bonded. A height of the first protrusions 14 is 10 nm, and a width 16 is 1 µm. Further, a height of the second protrusions 14 is 2 nm, and a width 17 is 1 µm.

Next, as shown in FIG. 1D, the second silicon substrate 18 is fusion bonded. In FIG. 1D, an SOI substrate as described above is used as the second silicon substrate 18. Since the height of the second protrusions 15 generated in the process of FIG. 1C is 2 nm and thus a surface roughness Rms is Rms <5 nm, the fusion bonding can be performed without having to perform the process of FIG. 4D of the comparative example. Next, as shown in FIG. 1E, the second silicon substrate 18 is thinned to form a monocrystal silicon vibration film 23. Formation hereof can be made similar to FIG. 4F of the comparative example.

Next, as shown in FIG. 1F, a contact hole 25 is formed from a side on which the vibration film 23 is formed so as to ensure conduction of the first silicon substrate 1. Formation hereof can be made similar to FIG. 4G of the comparative example. Next, as shown in FIG. 1G and FIG. 2, an electrode 27 and a first electrode pad 26 necessary for applying voltages to respective capacitive transducer elements 101 are provided. Formation hereof can be made similar to FIG. 4H of the comparative example.

A breakdown voltage of the cells of the capacitive transducer array produced in the present example will be described with reference to FIG. 3. Compared to the comparative example, since the process of FIG. 4D is not performed, a thickness 12 of the second insulating film 10 at the gap bottom surfaces 33 is substantially even, and flatness of the gap bottom surfaces 33 is improved. In the case of the present example, the thickness 12 of the second insulating film 10 at the gap bottom surfaces 33 is substantially even at 200 nm. The breakdown voltage becomes 160 V.

As described above, the protrusions at the bonding interface generated after having formed the second insulating layer 10 can be reduced by making the width 4 of the barrier wall 3 on the first silicon substrate 1 side larger than the other width 5. Further, since the bonding with the second silicon substrate 18 can be made without removing the protrusions at the bonding interface, and the elements 101 can be made thereby, the flatness of the insulating film 10 at the gap bottom surfaces can be improved. Due to this, a variation in the breakdown strength among the cells in the element and among the elements of the capacitive transducer can be reduced, evenness of the device can be increased, and reliability can be improved.

EXAMPLE 2

Example in Case of Providing a Slope-Shaped Barrier Wall

A method of manufacturing a capacitive transducer of the example 2 will be described with reference to FIGS. 5A to 5G, FIG. 2, and FIG. 6. The manufacturing method of the present example is substantially the same as the example 1. FIGS. 5A to 5G are cross sectional diagrams for describing the manufacturing method of the present example, and FIG. 2 is a diagram of a top view of the capacitive transducer of the present example. A cross sectional diagram along 1G-1G of FIG. 2 is FIG. 5G. FIG. 6 is a partially-enlarged diagram of FIG. 5C. In the example 2, a slope-shaped barrier wall 3 is formed.

Figure 5A:
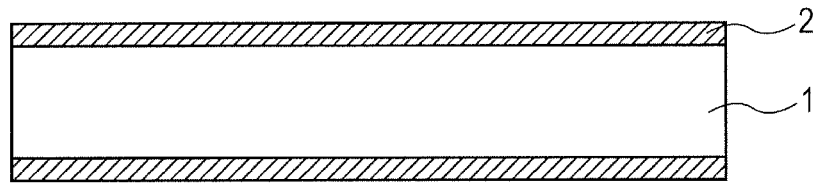
FIGS. 5A, 5B, 5C, 5D, 5E, 5F, and 5G are explanatory diagrams for a manufacturing method for a capacitive transducer of another embodiment.
Figure 5B:
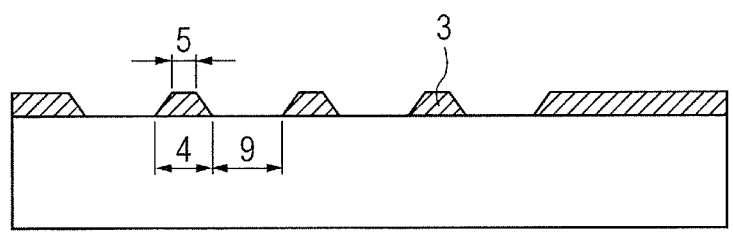
Figure 6:
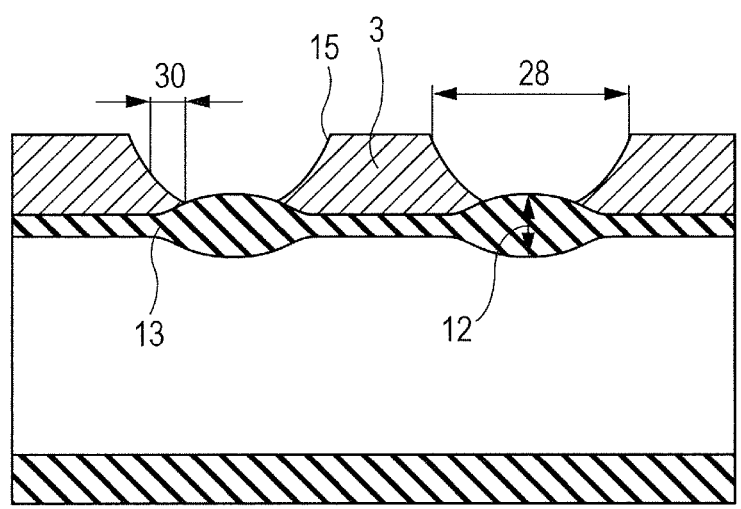
FIG. 6 is a partially-enlarged view of FIG. 5C.

As shown in FIG. 5A, in the present example also, an insulating layer 2 is formed on a first silicon substrate 1. Formation hereof can be made similar to FIG. 1A of the example 1. Next, as shown in FIG. 5B, a barrier wall 3 is formed. The barrier wall 3 can be formed by wet etching or dry etching. In the case of the present example, the barrier wall 3, as shown in FIG. 5B, can be formed by performing exposure using a gradation mask, and performing dry etching. A width 4 of the barrier wall 3 on the first silicon substrate 1 side is 17 µm, and a width 5 on the other side is 5 µm. A height of the barrier wall 3 is 220 nm. An arrangement interval 9 of the barrier wall 3 is 38 µm, and cells are formed to be arranged four rows by four columns.

Figure 5C:
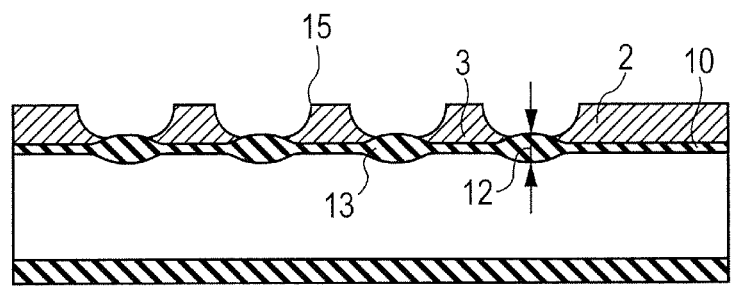

Next, as shown in FIG. 5C, a second insulating layer 10 is formed. In the present example also, it is formed by wet oxidation. An oxidation temperature is 1050 degrees Celsius. The second insulating layer 10 is silicon oxide formed by thermal oxidation, and its thickness 12 is 200 nm at bottom surfaces of gaps 24. When the second insulating layer 10 is formed, bird's beaks 13 are generated at ends of the barrier wall 3. In the present example, since wall surfaces of the barrier wall 3 are formed as moderately sloped surfaces, local protrusions 14 are not generated. The first insulating layer 2 that is pushed up by the bird's beaks 13 comes to have a shape as shown in FIG. 6 due to the sloped surfaces of the barrier wall 3 being pushed up. A surface roughness Rms at a bonding interface with a second silicon substrate 18 comes to be at 1 nm, and a width 30 of the portion that is somewhat pushed up by the bird's beaks comes to be at 1 µm, so fusion bonding can be performed even without performing the process of FIG. 4D of the comparative example.

Figure 5D:
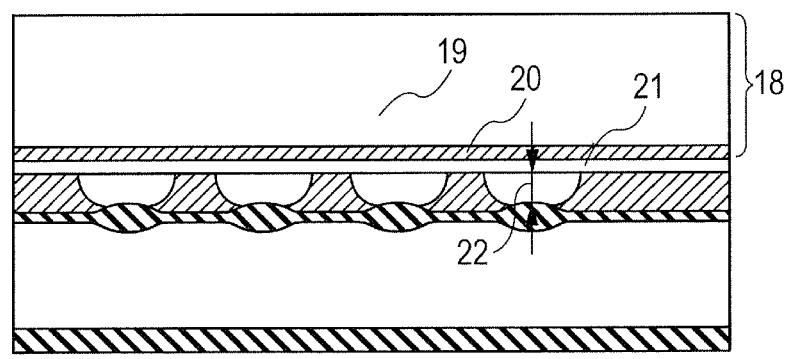
Figure 5E:
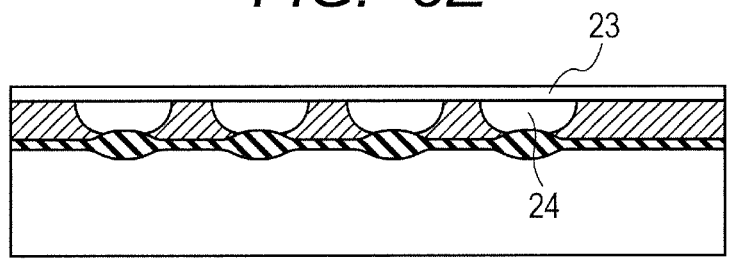
Figure 5F:
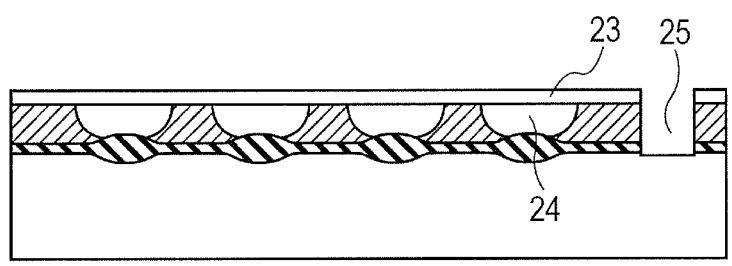
Figure 5G:
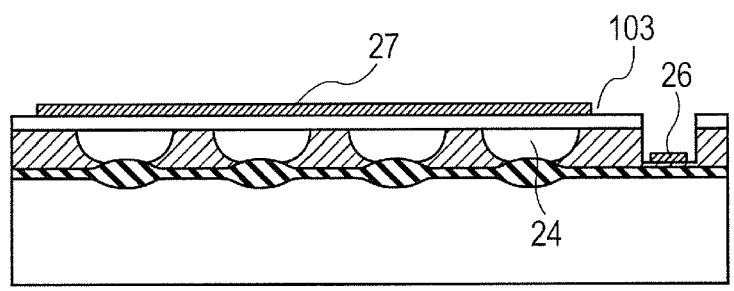

Next, as shown in FIG. 5D, the second silicon substrate 18 is fusion bonded. In FIG. 5D also, an SOI substrate is used as the second silicon substrate 18. Next, as shown in FIG. 5E, the second silicon substrate 18 is thinned, and a monocrystal silicon vibration film 23 is formed. Formation hereof can be made similar to FIG. 1E of the example 1. Next, as shown in FIG. 5F, a contact hole 25 is formed from a side on which the vibration film 23 is formed so as to ensure conduction of the first silicon substrate 1. Formation hereof can be made similar to FIG. 1F of the example 1. Next, as shown in FIG. 5G and FIG. 2, an electrode 27 and a first electrode pad 26 that are necessary for applying voltages to the respective capacitive transducer elements 101 are provided. Formation hereof can be made similar to FIG. 1G of the example 1.

A breakdown voltage of the cells 102 of the capacitive transducer array produced in the present example will be described with reference to FIG. 6. Compared to the comparative example, since the process of FIG. 4D is not performed, a thickness 12 of the second insulating film 10 at the gap bottom surfaces 33 is substantially even, and flatness of the gap bottom surfaces is improved. In the case of the present example, the thickness 12 of the second insulating film at the gap bottom surfaces is substantially even at 200 nm. The breakdown voltage is 160 V. Similar effects as that of the example 1 can be achieved in the present example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-204970, filed Sep. 20, 2011, which is hereby incorporated by reference herein in its entirety.

What is claimed is:

1. A method of manufacturing an electromechanical transducer, the method comprising:
    forming a barrier wall by forming a first insulating layer on a first substrate and removing a part of the first insulating layer to the first substrate;
    forming a second insulating layer on a region of the first substrate after the part of the first insulating layer has been removed;
    forming a gap by bonding a second substrate on the barrier wall; and
    forming a vibration film that is opposed to the second insulating layer via the gap from the second substrate,
    wherein, in the forming of the barrier wall, the barrier wall is formed such that, in a direction vertical to the first substrate, a height of the barrier wall on a gap side becomes lower than a height of a center portion.

2. The method of manufacturing an electromechanical transducer according to claim 1, wherein the first substrate is a silicon substrate.

3. The method of manufacturing an electromechanical transducer according to claim 1, wherein the second substrate is a silicon substrate.

4. The method of manufacturing an electromechanical transducer according to claim 1, wherein the second insulating layer is an oxide film.

5. The method of manufacturing an electromechanical transducer according to claim 1, wherein the vibration film is formed by thinning the second substrate.

6. The method of manufacturing an electromechanical transducer according to claim 1, wherein a wall surface of the barrier wall has a step shape including at least one level, or it has a sloped shape.

7. The method of manufacturing an electromechanical transducer according to claim 1, wherein, in the forming of the barrier wall, the barrier wall is formed such that the height of the barrier wall on the gap side after the forming of the second insulating layer does not become higher than the height of the center portion.

\* \* \* \* \*